(12) United States Patent
Chung et al.

(10) Patent No.: US 10,281,088 B2
(45) Date of Patent: May 7, 2019

(54) LED DEVICE AND LED LAMP INCLUDING THE SAME

(71) Applicant: SAMSUNG ELECTRONICS CO., LTD., Suwon-si (KR)

(72) Inventors: Jin Wook Chung, Yongin-si (KR); Kyung Wook Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/656,094

(22) Filed: Jul. 21, 2017

(65) Prior Publication Data

US 2018/0216787 A1 Aug. 2, 2018

(30) Foreign Application Priority Data

Jan. 31, 2017 (KR) ........................ 10-2017-0013794

(51) Int. Cl.
| | |
|---|---|
| *F21K 9/232* | (2016.01) |
| *H01L 33/50* | (2010.01) |
| *H01L 33/60* | (2010.01) |
| *H01L 33/06* | (2010.01) |
| *H01L 33/32* | (2010.01) |
| *H01L 33/56* | (2010.01) |

(Continued)

(52) U.S. Cl.
CPC .............. *F21K 9/232* (2016.08); *H01L 33/06* (2013.01); *H01L 33/32* (2013.01); *H01L 33/502* (2013.01); *H01L 33/56* (2013.01); *H01L 33/60* (2013.01); *H01L 33/641* (2013.01); *F21K 9/23* (2016.08); *F21K 9/27* (2016.08); *F21V 3/02* (2013.01); *F21Y 2107/00* (2016.08); *F21Y 2115/10* (2016.08); *H01L 25/0753* (2013.01); *H01L 33/505* (2013.01); *H01L 33/62* (2013.01); *H01L 2224/49107* (2013.01); *H01L 2224/73265* (2013.01)

(58) Field of Classification Search
CPC ........ F21K 9/232; H01L 33/502; H01L 33/60
USPC .................................................. 362/249.02
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |

(Continued)

FOREIGN PATENT DOCUMENTS

| | | |
|---|---|---|
| JP | 2016539480 A | 12/2016 |
| KR | 101428796 B1 | 8/2014 |

*Primary Examiner* — Toan C Ly
(74) *Attorney, Agent, or Firm* — Sughrue Mion, PLLC

(57) ABSTRACT

An LED device includes a transparent substrate having a bar-like shape and having a first surface and a second surface opposed thereto, a plurality of LED chips mounted on the first surface of the transparent substrate and electrically connected to each other, each of the plurality of LED chips having a reflective layer disposed on a surface mounted in the transparent substrate, a first connection terminal and a second connection terminal disposed on opposing ends of the transparent substrate and electrically connected to the plurality of LED chips, a bonding layer interposed between the plurality of LED chips and the transparent substrate and including a metal filler, and a wavelength conversion portion covering the first surface and the second surface of the transparent substrate and the plurality of LED chips.

17 Claims, 6 Drawing Sheets

(51) Int. Cl.
    *H01L 33/64* (2010.01)
    *H01L 25/075* (2006.01)
    *H01L 33/62* (2010.01)
    *F21K 9/27* (2016.01)
    *F21Y 115/10* (2016.01)
    *F21V 3/02* (2006.01)
    *F21K 9/23* (2016.01)
    *F21Y 107/00* (2016.01)

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,154,033 B2 | 4/2012 | Liu | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,710,723 B1 | 4/2014 | Wu | |
| 8,735,931 B2 | 5/2014 | Han et al. | |
| 8,766,295 B2 | 7/2014 | Kim | |
| 9,366,390 B2 | 6/2016 | Kuo et al. | |
| 2002/0043926 A1* | 4/2002 | Takahashi | C03C 3/045 313/503 |
| 2013/0058080 A1* | 3/2013 | Ge | F21V 3/00 362/231 |
| 2013/0240937 A1 | 9/2013 | Chae et al. | |
| 2014/0175377 A1* | 6/2014 | D'Evelyn | H01L 33/44 257/13 |
| 2014/0369036 A1 | 12/2014 | Feng | |
| 2015/0014732 A1 | 1/2015 | DeMille et al. | |
| 2016/0043279 A1* | 2/2016 | Jean | H01L 33/325 257/13 |
| 2016/0329461 A1* | 11/2016 | Huang | H01L 33/46 |
| 2016/0363267 A1* | 12/2016 | Jiang | F21V 29/70 |
| 2016/0377237 A1 | 12/2016 | Zhang | |
| 2017/0084809 A1* | 3/2017 | Jiang | F21K 9/232 |
| 2017/0097123 A1* | 4/2017 | Tischler | H04N 1/02865 |
| 2017/0130906 A1* | 5/2017 | Jiang | H01L 33/62 |

\* cited by examiner

LED DEVICE AND LED LAMP INCLUDING THE SAME

CROSS-REFERENCE TO RELATED APPLICATION

This application claims the benefit of Korean Patent Application No. 10-2017-0013794, filed on Jan. 31, 2017, with the Korean Intellectual Property Office, the disclosure of which is incorporated herein by reference in its entirety.

BACKGROUND

1. Field

The present disclosure relates to a light emitting diode (LED) device and an LED lamp including the same.

2. Description of Related Art

In general, incandescent lamps or fluorescent lamps have been commonly used as indoor or outdoor lighting devices. However, a problem in which incandescent lamps or fluorescent lamps may need to be frequently replaced due to a relatively short lifespan thereof is present.

In order to solve such a problem, lighting apparatuses, including LEDs, having characteristics such as excellent controllability, relatively high response speeds, relatively high photoelectric conversion efficiency, relatively long lifespans, a relatively low level of power consumption, and a relatively high degree of brightness, have been developed. In other words, since LEDs have relatively high photoelectric conversion efficiency, power consumption thereof is relatively low. In addition, since LEDs do not emit light through heating, preheating time is not required, thereby resulting in a relatively high speed of turning LEDs on and off.

In addition, LEDs are more shock-resistant than the incandescent lamps and fluorescent lamps of the related art and consume less power through adoption of a stable direct current method of turning on LEDs. A lifespan thereof is semipermanent, while LEDs may generate lighting effects of various colors. Since LEDs use relatively small light sources, LEDs may be miniaturized, thereby expanding the use thereof in the lighting industry.

As such, since the use of LEDs in the lighting industry has been expanded, various demands for LED lighting apparatuses have increased. In detail, LEDs may provide the same amount of light as lighting apparatuses of the related art using a lower level of power. In addition, demand for lighting apparatuses having light distribution characteristics unobtainable in lighting apparatuses of the related art has also increased.

SUMMARY

An aspect of the present disclosure may provide a light emitting diode (LED) device having reduced optical interference and an LED lamp including the same.

According to an aspect of the present disclosure, an LED device includes a transparent substrate having a bar shape and including a first surface and a second surface opposed thereto, a plurality of LED chips mounted on the first surface of the transparent substrate and electrically connected to each other, each of the plurality of LED chips including a reflective layer disposed on or surface-mounted on the transparent substrate, a first connection terminal and a second connection terminal disposed on opposing ends of the transparent substrate and electrically connected to the plurality of LED chips, a bonding layer interposed between the plurality of LED chips and the transparent substrate and including a metal filler, and a wavelength conversion portion covering the first surface and the second surface of the transparent substrate and the plurality of LED chips.

According to an aspect of the present disclosure, an LED lamp includes a bulb, a base portion coupled to an end of the bulb, and a plurality of LED devices accommodated in an internal space of the bulb and disposed above a central portion of the internal space. Each of the plurality of LED devices includes a transparent substrate having a bar shape and including a first surface, and a second surface opposed thereto, a plurality of LED chips mounted on the first surface of the transparent substrate and electrically connected to each other, each of the plurality of LED chips including a reflective layer disposed on or surface-mounted on the transparent substrate, a first connection terminal and a second connection terminal, disposed on opposing ends of the transparent substrate and electrically connected to the plurality of LED chips, a bonding layer interposed between the plurality of LED chips and the transparent substrate and including a metal filler, and a wavelength conversion portion covering the first surface and the second surface of the transparent substrate and the plurality of LED chips. The first surface is disposed toward the bulb.

In one example embodiment, there is a light emitting diode (LED) device including: a transparent substrate having a bar-like shape and including a first surface and a second surface opposed to the first surface; a plurality of LED chips mounted on the first surface of the transparent substrate, one LED chip of the plurality of LED chips including a reflective layer, the plurality of LED chips being surface-mounted on the transparent substrate; a first connection terminal and a second connection terminal that are disposed on opposing ends of the transparent substrate and electrically connected to the plurality of LED chips; a bonding layer interposed between the plurality of LED chips and the transparent substrate and including a metal filler; and a wavelength conversion portion covering the first surface of the transparent substrate, the second surface of the transparent substrate, and the plurality of LED chips.

In another example embodiment, there is a light emitting diode (LED) lamp including: a bulb; a base portion connected to an end of the bulb; and a plurality of LED devices disposed in an internal space of the bulb and disposed above a central portion of the internal space. One LED device of the plurality of LED devices includes: a transparent substrate having a bar-like shape and including a first surface and a second surface opposed to the first surface; a plurality of LED chips mounted on the first surface of the transparent substrate, one of the plurality of LED chips including a reflective layer, the plurality of LED chips being surface-mounted on the transparent substrate; a first connection terminal and a second connection terminal that are disposed on opposing ends of the transparent substrate and electrically connected to the plurality of LED chips; a bonding layer interposed between the plurality of LED chips and the transparent substrate and including a metal filler; and a wavelength conversion portion covering the first surface of the transparent substrate, the second surface of the transparent substrate, and the plurality of LED chips, the first surface being disposed toward the bulb.

In yet another example embodiment, there is a light emitting diode (LED) lamp including: a bulb; a base disposed below the bulb; and a plurality of LED devices disposed inside the bulb. One LED device of the plurality of LED devices includes: a transparent substrate having an elongated shape and including one side that is facing outwardly out of the bulb in an outward direction; and a plurality of LED chips mounted on the one side of the transparent substrate. One LED chip of the plurality of LED chips includes: a light emitting structure; and a reflective layer disposed between the light emitting structure and the transparent substrate, and configured to reflects light emitted from the light emitting structure which travels in an inward direction toward the transparent substrate, toward the outward direction.

BRIEF DESCRIPTION OF DRAWINGS

The above and other aspects, features and other advantages of the present disclosure will be more clearly understood from the following detailed description, when taken in conjunction with the accompanying drawings, in which.

DETAILED DESCRIPTION

Figure 1:
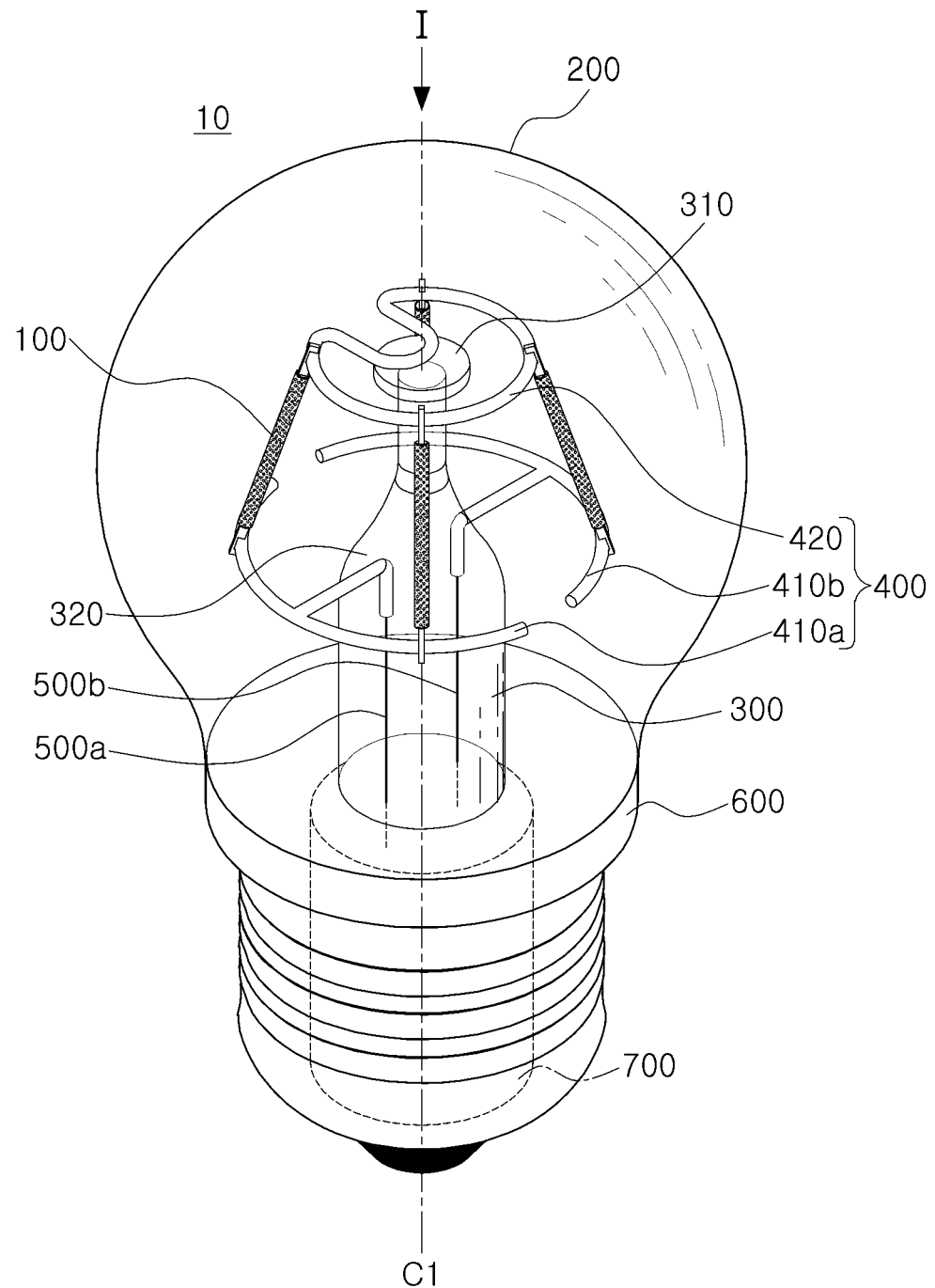
FIG. 1 is a perspective view of a light emitting diode (LED) lamp according to an example embodiment of the present disclosure.
Figure 2:
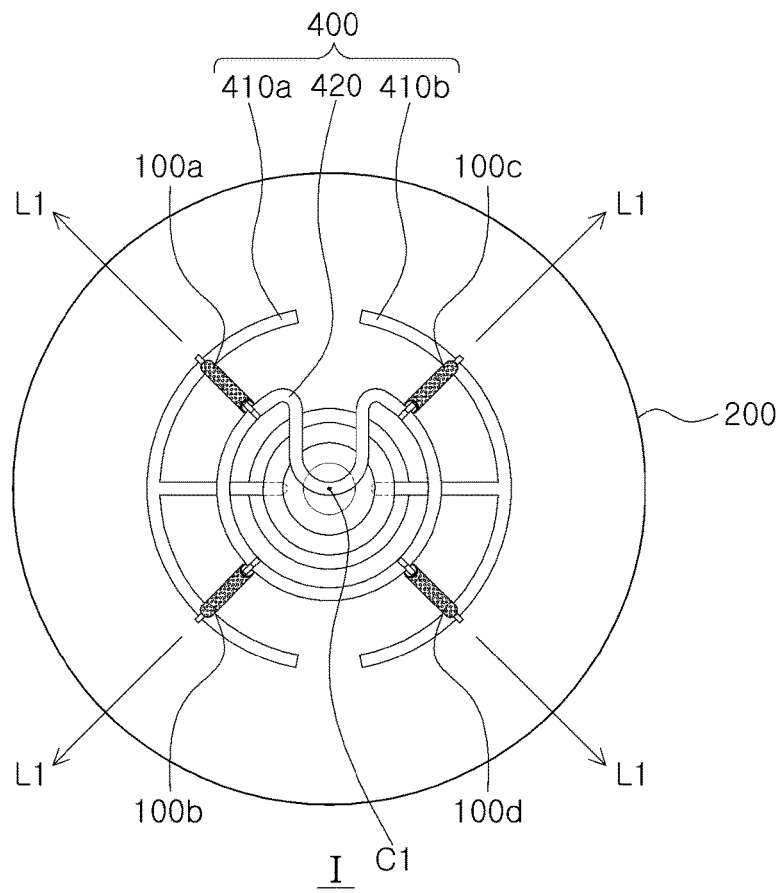
FIG. 2 is a top view taken in direction I of FIG. 1.

FIG. 1 is a perspective view of a light emitting diode (LED) lamp according to an example embodiment of the present disclosure, while FIG. 2 is a top view taken in direction I of FIG. 1. In an example embodiment, the direction I in FIG. 1 also indicates a central axis of the LED lamp.

With reference to FIGS. 1 and 2, an LED lamp 10 may include a bulb 200, a base portion 600, e.g., a base, coupled to an end of the bulb 200, e.g., the base is disposed below the bulb 200, and a plurality of LED devices 100 accommodated in an internal space of the bulb 200. In an example embodiment, a first center of the bulb 200 and a second center of the base are disposed along the central axis, and the plurality of LED devices 100 are disposed inside the bulb 200 and disposed about the central axis.

The bulb 200 may be provided as a transparent, milky, lusterless, colored bulb cover formed using glass, hard glass, quartz glass, or a light transmissive resin. The bulb 200 may be provided as a bulb-type cover of a lighting device of the related art, such as an A-type, a G-type, an R-type, a PAR-type, a T-type, an S-type, a candle-type, a P-type, a PS-type, a BR-type, an ER-type, a BRL-type lighting device, or other types.

The base portion 600 may be coupled to the bulb 200 to form an outer form of the LED lamp 10 and may be configured to be of certain types such as an E40-type, an E27-type, an E26-type, an E14-type, a GU-type, a B22-type, a BX-type, a BA-type, an EP-type, an EX-type, a GY-type, a GX-type, a GR-type, a GZ-type, a G-type base portion, or the like, in order to be replaceable with a lighting device of the related art. Electric power applied to the LED lamp 10 may be applied thereto through the base portion 600. A power supply portion 700 may be disposed in an internal space of the base portion 600, thereby converting electric power applied through the base portion 600 from alternating current (AC) to direct current (DC) or changing a voltage to be supplied to the plurality of LED devices 100.

In a central portion C1 of the base portion 600, one end of a support 300 in which a frame 400 is disposed, in order to fix, e.g., attach, the plurality of LED devices 100, may be disposed to be fixed, e.g., attach, therein.

The support 300 may be formed using glass, hard glass, quartz glass, or a light transmissive resin, in a manner similar to that of the bulb 200, thereby transmitting light emitted by the plurality of LED devices 100. The support 300 may form a sealed internal space in such a manner that the support 300 covers an open area of the bulb 200 and is welded by heating at relatively high temperatures. Thus, the plurality of LED devices 100 disposed in the internal space of the bulb 200 may be shielded from external moisture, and the like.

The frame 400 may be formed using a metal, in order to fix, e.g., attach, the plurality of LED devices 100 and supply electric power thereto. The frame 400 may include a connection frame 420 connecting a plurality of LED devices 100, including LED device 100a, LED device 100b, LED device 100c, and LED device 100d to each other and may include at least an electrode frame, e.g., a first electrode frame 410a and a second electrode frame 410b to supply electric power.

At another end of the support 300, a mounting portion 310 to fix, e.g., attach, the connection frame 420 may be formed. The first electrode frame 410a and the second electrode frame 410b may be disposed so as to be fixed, e.g., attached, to an intermediate portion of the support 300, in order to support a plurality of LED devices 100 welded to the first electrode frame 410a and the second electrode frame 410b. The first electrode frame 410a and the second electrode frame 410b may be connected to a first wire 500a and a second wire 500b, embedded in the support 300, respectively, so that electric power supplied by the power supply portion 700 may be applied thereto.

The plurality of LED devices 100 may be accommodated in the internal space of the bulb 200. Since each of the plurality of LED devices 100 is manufactured to have a form similar to a filament of an incandescent lamp of a related art, each of the plurality of LED devices 100 may emit linear light in the same manner as a filament when electric power is applied thereto. Thus, each of the plurality of LED devices 100 is also referred to as 'an LED filament'.

With reference to FIG. 2, when taken from above the LED lamp 10 (in direction I), the plurality of LED devices 100 may be disposed to have rotational symmetry around the central portion C1 of the base portion 600.

Figure 3:
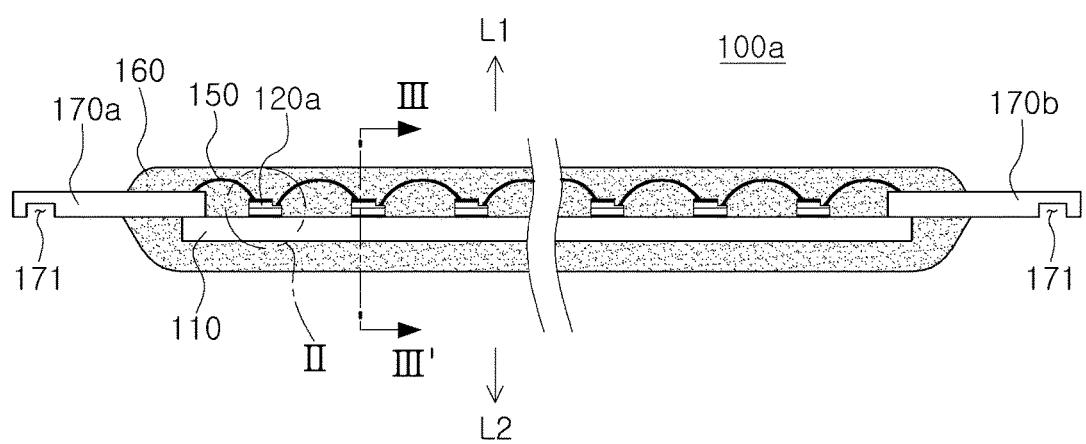
FIG. 3 is a side cross-sectional view of an LED device of FIG. 1.
Figure 4A:
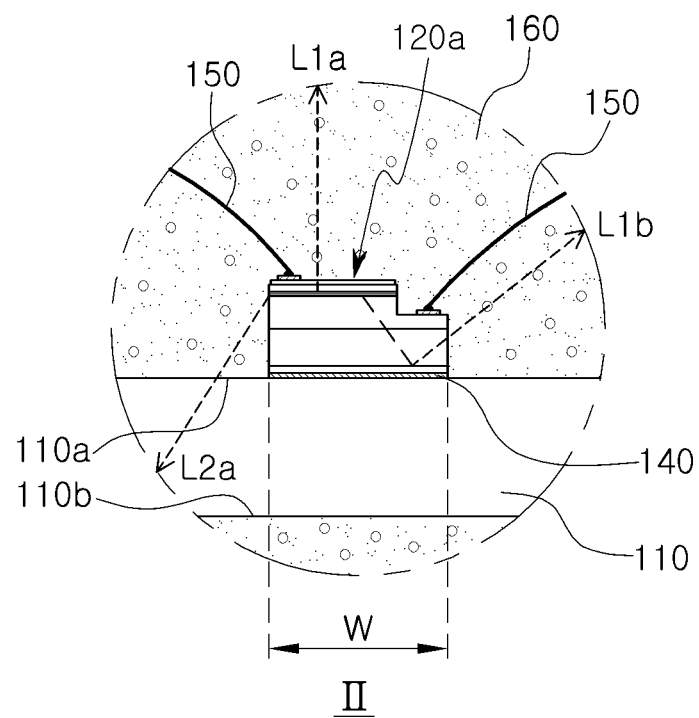
FIG. 4A is an enlarged view of portion II of FIG. 3.
Figure 4B:
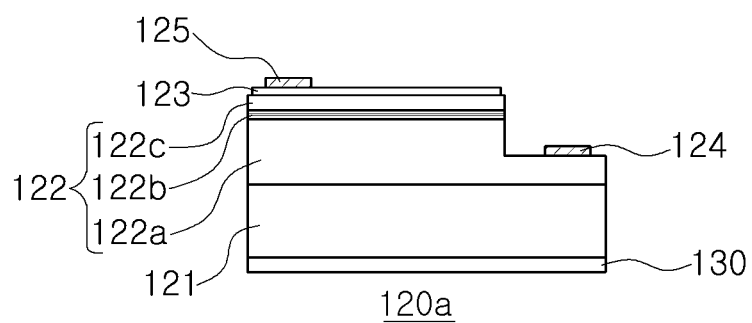
FIG. 4B is an enlarged view of an LED chip of FIG. 4A.
Figure 5A:
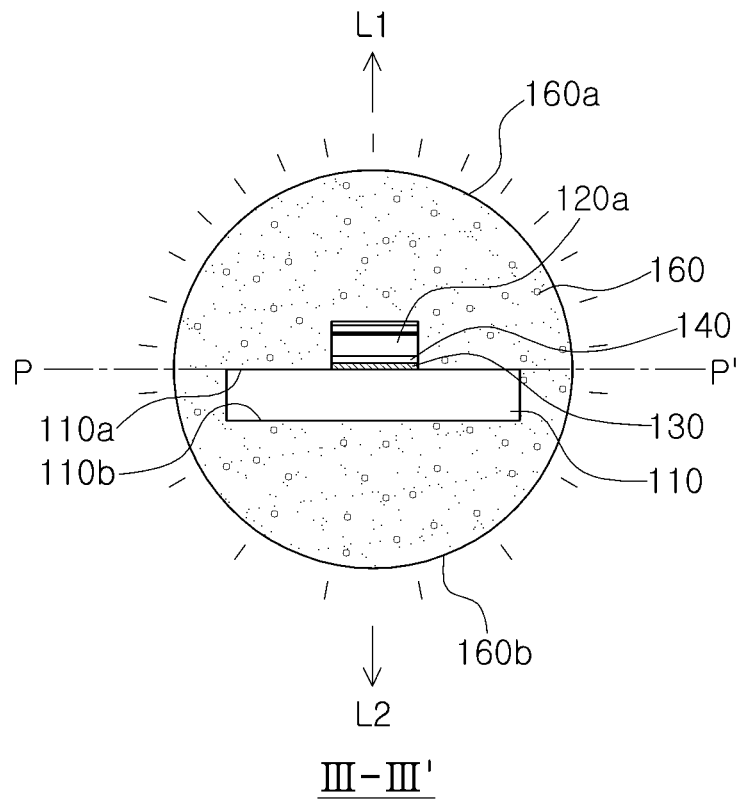
FIG. 5A is a side cross-sectional view taken in direction III-III' of FIG. 3.
Figure 5B:
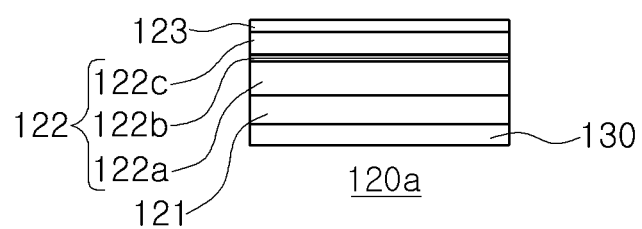
FIG. 5B is an enlarged view of the LED chip of FIG. 5A.

FIG. 3 is a side cross-sectional view of one LED device, i.e., an LED device 100a, of the plurality of LED devices 100 of FIG. 1, FIG. 4A is an enlarged view of portion II of FIG. 3, and FIG. 4B is an enlarged view of one LED chip, i.e., an LED chip 120a, of FIG. 4A. FIG. 5A is a side cross-sectional view taken in direction III-III' of FIG. 3, while FIG. 5B is an enlarged view of the LED chip 120a of FIG. 5A.

With reference to FIGS. 3 to 5B, an LED device 100a may include a plurality of LED chips 120 electrically connected in series, in parallel, or in series-parallel, therein.

In detail, the LED device 100*a* may include a transparent substrate 110 having a first surface 110*a* and a second surface 110*b*, the plurality of LED chips 120 surface-mounted on the first surface 110*a*, a first connection terminal 170*a*, a second connection terminal 170*b*, and a bonding layer 140. The plurality of LED devices 100 may be disposed to have rotational symmetry while surrounding a support 300 in such a manner that the first surface 110*a* is disposed outwardly toward the bulb 200 in an internal space of the bulb 200, i.e., the first surface 110*a* is disposed to face an outward direction. As subsequently described, a reflective layer 130 may be disposed in a lower portion of one LED chip 120*a* of the plurality of LED chips 120, thereby increasing an intensity of light emitted forwardly or outwardly from the LED chip 120*a*. Thus, the LED device 100*a* may be provided in such a manner that the intensity of light (hereinafter, referred to as 'forward light') L1 emitted forwardly from the transparent substrate 110 including the plurality of LED chips 120 mounted therein may be greater than the intensity of light (hereinafter, referred to as 'rearward light') L2 emitted rearwardly from the transparent substrate 110.

The transparent substrate 110 may have a first surface 110*a* and a second surface 110*b* opposed thereto and may have a plate shape that is elongated in a single direction or having an elongated shape. The transparent substrate 110 may be manufactured using glass, hard glass, quartz glass, transparent ceramics, sapphire, plastics, or the like. The transparent substrate 110 may transmit lateral light emitted by the LED chip 120*a* to allow the lateral light to be incident on a wavelength conversion portion 160 disposed on the second surface 110*b*. Thus, since a wavelength of light emitted by the LED chip 120*a* is uniformly converted, uniformity of the light emitted by the LED chip 120*a* may be improved.

On opposing ends of the transparent substrate 110, a first connection terminal 170*a* and a second connection terminal 170*b* may be disposed to fix, e.g., attach, the LED device 100*a* to the frame 400 and to apply electric power thereto. A fixing groove 171 may be disposed on at least one surface of the first connection terminal 170*a* and the second connection terminal 170*b*, to thereby indicate a first direction of the first surface 110*a* or a second direction of the second surface 110*b* of the transparent substrate 110. In an example embodiment, the fixing groove 171 includes a first fixing groove disposed at the first connection terminal 170*a* and a second fixing groove disposed at the second connection terminal 170*b*. In a case in which the LED device 100*a* is held and fixed, e.g., attached, at its fixing groove 171 by a connection frame 420 or a first electrode frame 410*a* and a second electrode frame 410*b*, the first surface 110*a* of the LED device 100*a* may be naturally disposed in a direction toward a bulb 200, and the second surface 110*b* may be disposed toward a central portion C1. In an example embodiment, the first surface 110*a* is one side that is facing outwardly out of the bulb 200 in an outward direction.

With reference to FIG. 3, at least one of the plurality of LED chips 120 may be disposed on the transparent substrate 110 in a length direction of the transparent substrate 110. In a case in which the plurality of LED chips 120 are disposed, the plurality of LED chips 120 may be connected in series, in parallel, or in series-parallel through a wire 150. The plurality of LED chips 120 may be directly mounted on the transparent substrate 110 in a form of chip on board (COB) without a separate package.

With reference to FIG. 3, the LED chip 120*a* may comprise a light emitting structure 122 including a first conductivity-type semiconductor layer 122*a*, an active layer 122*b* having a multiple quantum well (MQW) structure, and a second conductivity-type semiconductor layer 122*c*, sequentially disposed on a light transmissive substrate 121 and may include the reflective layer 130. In an example embodiment, the light emitting structure 122 is disposed on an upper surface of the light transmissive substrate 121 and includes a light emitting layer including the active layer 122*b* having a multiple quantum well (MQW) structure.

The light transmissive substrate 121 may be provided as a semiconductor growth substrate including a material, such as sapphire, silicon carbide (SiC), magnesium aluminate ($MgAl_2O_4$), magnesium oxide (MgO), lithium aluminate ($LiAlO_2$), lithium gallate ($LiGaO_2$), gallium nitride (GaN), or the like. In this case, sapphire is a crystal having Hexa-Rhombo R3c symmetry, has lattice constants of 13.000 Å and 4.758 Å in directions of a c-axis and an a-axis, respectively, and includes a C (0001) plane, an A (11-20) plane, an R (1-102) plane, and the like. In this case, since a nitride thin film may be relatively easily grown on the C plane, which is stable at relatively high temperatures, the C plane is commonly used for a nitride growth substrate.

The light transmissive substrate 121 may have surfaces opposing each other, and a concave-convex structure may be formed on at least one of the opposing surfaces thereof. The concave-convex structure may be provided by etching a portion of the light transmissive substrate 121 or by forming a hetero material layer, different from the light transmissive substrate 121.

The first conductivity-type semiconductor layer 122*a* may be provided as a nitride semiconductor satisfying n-type $Al_xIn_yGa1_{-x-y}N$ ($0 \le x<1$, $0 \le y<1$, $0 \le x+y<1$), while an n-type impurity may be provided as silicon (Si). The second conductivity-type semiconductor layer 122*c* may be provided as p-type $Al_xIn_yGa1_{-x-y}N$ ($0 \le x<1$, $0 \le y<1$, $0 \le x+y<1$), while a p-type impurity may be provided as magnesium (Mg). For example, the first conductivity-type semiconductor layer 122*a* may include n-type GaN, while the second conductivity-type semiconductor layer 122*c* may include p-type GaN. In addition, the second conductivity-type semiconductor layer 122*c* may be implemented to have a single layer structure. However, according to need, the second conductivity-type semiconductor layer 122*c* may have a multilayer structure including different compositions.

The active layer 122*b* may have an MQW structure in which a quantum well layer and a quantum barrier layer are alternately stacked. In detail, the quantum well layer and the quantum barrier layer may include $Al_xIn_yGa1_{-x-y}N$ ($0 \le x \le 1$, $0 \le y \le 1$, $0 \le x+y \le 1$) having different compositions. In a specific example, the quantum well layer may be provided as $In_xGa_{1-x}N$ ($0<x \le 1$), while the quantum barrier layer may be provided as GaN or AlGaN.

The LED chip 120*a* may include a first electrode 124 disposed on the first conductivity-type semiconductor layer 122*a* and may include an ohmic contact layer 123 and a second electrode 125, sequentially disposed on the second conductivity-type semiconductor layer 122*c*. In an example embodiment, the first electrode 124 and the second electrode 125 are disposed at a side or at sides of the LED chip 120*a* that is or are opposite to the first surface 110*a* of the transparent substrate 110 on which the plurality of LED chips 120 are surface-mounted.

The first electrode 124 and the ohmic contact layer 123 may include a material, such as silver (Ag), nickel (Ni), aluminum (Al), rhodium (Rh), palladium (Pd), iridium (Ir), ruthenium (Ru), magnesium (Mg), zinc (Zn), platinum (Pt), gold (Au), and the like, and may be employed to have a single layer structure or a multilayer structure, but are not limited thereto. The first electrode 124 may be provided as a contact electrode layer and may include chromium (Cr)/Au. The first electrode 124 may further include a pad electrode layer on a contact electrode layer. The pad electrode layer may be provided as an Au layer, a tin (Sn) layer, or an Au/Sn layer.

The ohmic contact layer 123 may be implemented variously according to a chip structure. For example, in a case in which the ohmic contact layer 123 has a flip-chip structure, the ohmic contact layer 123 may include Ag. In a case in which the ohmic contact layer 123 has an epi-up structure, the ohmic contact layer 123 may include a transmitting electrode. The transmitting electrode may be provided as either a transparent conductive oxide layer or a nitride layer. For example, the transmitting electrode may be provided as at least one selected from among indium tin oxide (ITO), zinc-doped indium tin oxide (ZITO), zinc indium oxide (ZIO), gallium indium oxide (GIO), zinc tin oxide (ZTO), fluorine-doped tin oxide (FTC), aluminum-doped zinc oxide (AZO), gallium-doped zinc oxide (GZO), $In_4Sn_3O_{12}$, and zinc magnesium oxide ($Zn_{(1-x)}Mg_xO$, $0 \le x \le 1$). The ohmic contact layer 123 may include graphene, according to need. The second electrode 125 may include Au, Sn or Au/Sn.

As illustrated in FIGS. 4B and 5B, the reflective layer 130 may be formed to cover a lower surface of the light transmissive substrate 121, and thereby reflects light Lib emitted in a direction of the light transmissive substrate 121, among light emitted by the active layer 122b, in a direction toward an upper portion of the LED chip 120a. Since the reflective layer 130 is disposed in the LED chip 120a, the intensity of the forward light L1 may be greater than that of the rearward light L2, based on a mounting surface P-P' extended from the first surface 110a of the transparent substrate 110. In other words, light L1a and light Lib except for lateral light L2a emitted in a direction of the transparent substrate 110, among light emitted by the active layer 122b, may be emitted forwardly from the LED chip 120a. In an example embodiment, the light Lib emitted from the active layer 122b which travels in an inward direction toward the transparent substrate 110, is reflected toward the outward direction, whereby the outward direction is not toward the central axis.

The reflective layer 130 may be formed at a wafer level during a process of manufacturing the plurality of LED chips 120. In a process of cutting the LED chip 120 based on an individual unit, the reflective layer 130 may also be cut based on an individual unit together. Thus, a side surface of the reflective layer 130 may be substantially coplanar with a surface of the light emitting structure 122 each other, while the reflective layer 130 and the light emitting structure 122 may be formed to have substantially the same width W. In an example embodiment, the reflective layer 130 has a first area substantially corresponding to a second area of a mounting surface P-V of the LED chip 120a of the plurality of LED chips 120.

The reflective layer 130 may be formed using at least one among high reflective metals, such as Ag, Al, Au, copper (Cu), Pt, Rh, Ru, Ni, Pd, Ir, Mg, and Zn, or may be provided as a distributed bragg reflector (DBR). In addition, as an example, DBR may also be formed in such a manner that a titanium dioxide ($TiO_2$) film and a silicon dioxide ($SiO_2$) film are paired, for example, in a scheme in which twenty-four layer pairs or forty-eight layer pairs are stacked. In more detail, a thickness of each of the $TiO_2$ film and the $SiO_2$ film is tens of nanometers (e.g., 40 nm to 100 nm), and may be several micrometers (e.g., 2.4 um) in the case of 24 layer pairs overall.

FIGS. 4A and 4B illustrate the LED chip 120a having an epi-up structure, but according to another example embodiment, in general, an LED chip having a flip-chip structure emitting light having a high intensity may also be used.

The bonding layer 140 may attach the LED chip 120a to the transparent substrate 110. In detail, the bonding layer 140 may be formed using a material having relatively high thermal conductivity so that heat generated by the LED chip 120a may be rapidly transmitted to the transparent substrate 110. In the case of a reflective layer including a pair of titanium dioxide ($TiO_2$) film and the $SiO_2$ film (or a plurality of pairs of $TiO_2$ film and $SiO_2$ film), thermal distribution capability is limited. Thus, in order to improve heat emission of an LED device, the bonding layer 140, including a material having relatively high thermal conductivity mixed therein, may be used. In detail, an opaque bonding layer such an opaque silicone adhesive having thermal conductivity of 1.0 W/m·K or more or an adhesive containing a thermally conductive metal filler may be used as the bonding layer 140. An Ag paste may also be used. Thus, since heat of the LED chip 120a is quickly dissipated, reliability of the LED chip 120a may be increased. An alumina filler may be used as the metal filler, but the present disclosure is not limited thereto.

The wavelength conversion portion 160 may be disposed to cover the transparent substrate 110 and the LED chip 120, thereby converting a wavelength of light emitted by the LED chip 120a. In the case of the wavelength conversion portion 160, a semi-curable resin may be mixed with a phosphor, a quantum dot, or the like, and surfaces of the transparent substrate 110 and the LED chip 120a may be coated therewith. The wavelength conversion portion 160 may be provided as a semi-curable (B-stage) composite in which a phosphor is mixed with a polymer binder including a resin, a curing agent, a curing catalyst, and the like.

As a phosphor, a garnet-based phosphor, such as YAG, TAG, and LuAG, a silicate-based phosphor, a nitride-based phosphor, a sulphide-based phosphor, an oxide-based phosphor, or the like, may be used. Furthermore, a phosphor may be provided as a single phosphor or a plurality of phosphors mixed at a predetermined ratio.

As a resin used in the wavelength conversion portion 160, an epoxy resin or a silicone resin, an inorganic polymer, satisfying requirements for high bondability, high light transmittance, high thermal resistance, high light refractive index, moisture resistance, and the like, may be used. For example, in order to secure high bondability, a silane material may be employed as an additive to improve adhesion.

A method of forming the wavelength conversion portion 160 may vary. For example, a resin including a phosphor may be discharged through a nozzle on a transparent substrate including a diode chip formed therein, thereby forming a front surface 160a of the wavelength conversion portion 160. In addition, a resin including a phosphor may be discharged again through a nozzle, thereby forming a rear surface 160b of the wavelength conversion portion 160.

As illustrated in FIG. 5A, a cross-sectional view of the wavelength conversion portion 160 may be circular, but is not limited thereto. The cross-sectional view thereof may be variously modified to have a structure in which the first surface 110a and the second surface 110b of the transparent substrate 110 and the LED chip 120a are covered.

FIGS. 6A to 6D are a variety of modified examples of a wavelength conversion portion 160. A description of the previously described composition will be omitted so as to prevent overlapping descriptions.

Figure 6A:
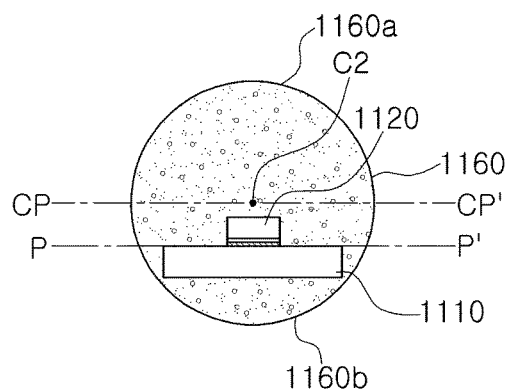
FIGS. 6A to 6D are modified examples of an LED device.

FIG. 6A has a feature in which, based on a plane extended from the first surface of a transparent substrate 1110, a first portional area of a first portion of the wavelength conversion portion 1160 disposed toward the bulb 200 is greater than a second portional area of a second portion of the wavelength conversion portion 1160, and a surface of the second portion of the wavelength conversion portion 1160 is disposed toward the central portion. Specifically, a mounting surface, i.e., a mounting surface P-P', extended from a first surface of a transparent substrate 1110 is disposed below a surface CP-CP' passing through a center C2 of a wavelength conversion portion 1160, so that an area of a front surface 1160*a* of the wavelength conversion portion 1160 may be disposed to be greater than that of a rear surface 1160*b*. As the area of the front surface 1160*a* is increased, an intensity of light emitted forwardly therefrom may be increased.

Figure 6B:
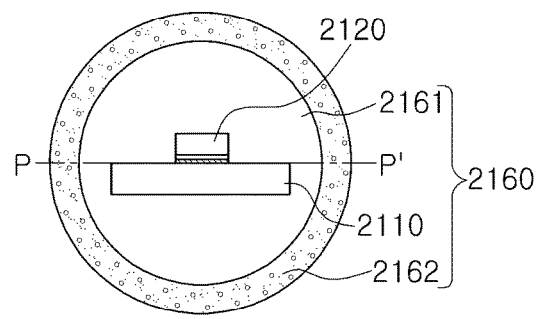

FIG. 6B has a feature in which a wavelength conversion portion 2160 includes a transparent layer 2161, e.g., transparent resin layer including a wavelength conversion material, in direct contact with an LED chip 2120 and a transparent substrate 2110, as well as a wavelength conversion layer 2162 covering the transparent layer 2161. Since the transparent layer 2161 is uniformly coated with the wavelength conversion layer 2162, wavelength conversion of light emitted by the LED chip 2120 may be controlled more precisely than an example embodiment described above.

Figure 6C:
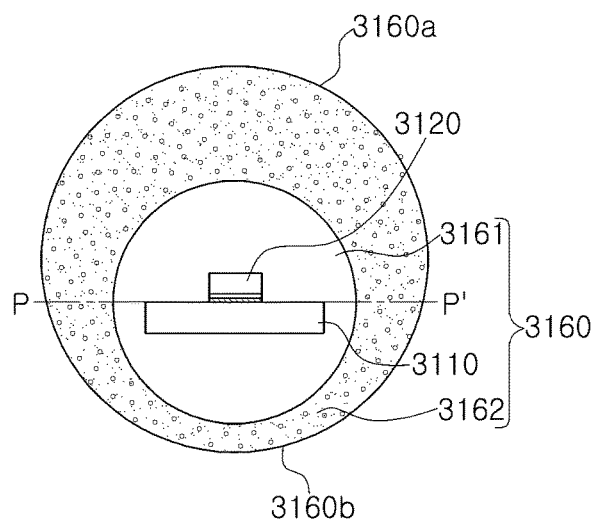

FIG. 6C is a modified example of FIG. 6B and has a feature in which a thickness of a portion of a wavelength conversion layer 3162 disposed in front of the mounting surface P-P' may be increased, so that an area of a front surface 3160*a* of the wavelength conversion layer 3162 may be greater than that of a rear surface 3160*b*. A wavelength conversion portion 3160 may be formed to include a transparent layer 3161 in direct contact with an LED chip 3120 and a transparent substrate 3110, as well as a wavelength conversion layer 3162 covering the transparent layer 3161, the same as an example embodiment of FIG. 6B. Compared with an example embodiment described above, as the area of the front surface 3160*a* is increased, an intensity of light emitted forwardly therefrom may be increased.

Figure 6D:
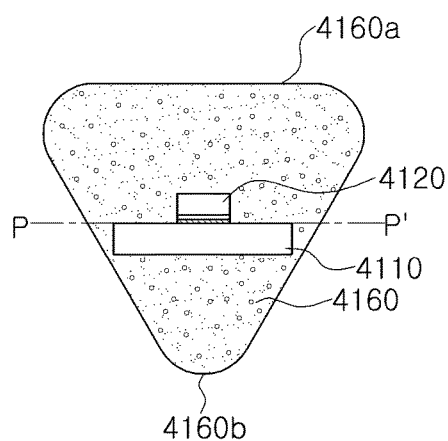

FIG. 6D has a feature in which a cross-sectional view of a wavelength conversion portion 4160 is formed to be triangular, so that an area of a front surface 4160*a* may be greater than that of a rear surface 4160*b*. An LED chip 4120 may be mounted on a transparent substrate 4110, and the wavelength conversion portion 4160 may cover the transparent substrate 4110 and the LED chip 4120, which is the same as an example embodiment of FIG. 6A. Compared with an example embodiment described above, as the area of the front surface 4160*a* is increased, an intensity of light emitted forwardly therefrom may be increased.

In the case of an LED device 100*a* having a composition described above, an intensity of light of a forward light L1 may be greater than that of a rearward light L2, based on the mounting surface P-P' extended from a first surface 110*a* of the transparent substrate 110. For example, the intensity of light of the forward light L1 may be greater than that of the rearward light L2 by about 10% to about 20% or about 20% to about 40% based on a wavelength band of 400 nm to 800 nm. Thus, in a case in which a plurality of LED devices 100 are disposed in an LED lamp, optical interference between the rearward light L2 emitted by each of the plurality of LED devices 100 may be reduced.

In an example embodiment, a wavelength conversion portion may have an asymmetric cross sectional area. Specifically, the wavelength conversion portion 1160, or wavelength conversion portions of other example embodiments above, which covers the transparent substrate 1110, or the transparent substrates of other example embodiments above, and the plurality of LED chips 1120, or plurality of LED chips of other example embodiments above, has an asymmetric cross sectional area. The asymmetric cross sectional area is configured so as to increase an intensity of light that is emitted toward the outward direction. Further, the asymmetric cross sectional area is further configured so that an outward portional area of the asymmetric cross sectional area above the one side of the transparent substrate 1110, or the transparent substrates of other example embodiments above, is larger than an inward portional area of the asymmetric cross sectional area below the one side of the transparent substrate 1110, or the transparent substrates of other example embodiments above.

Figure 7:
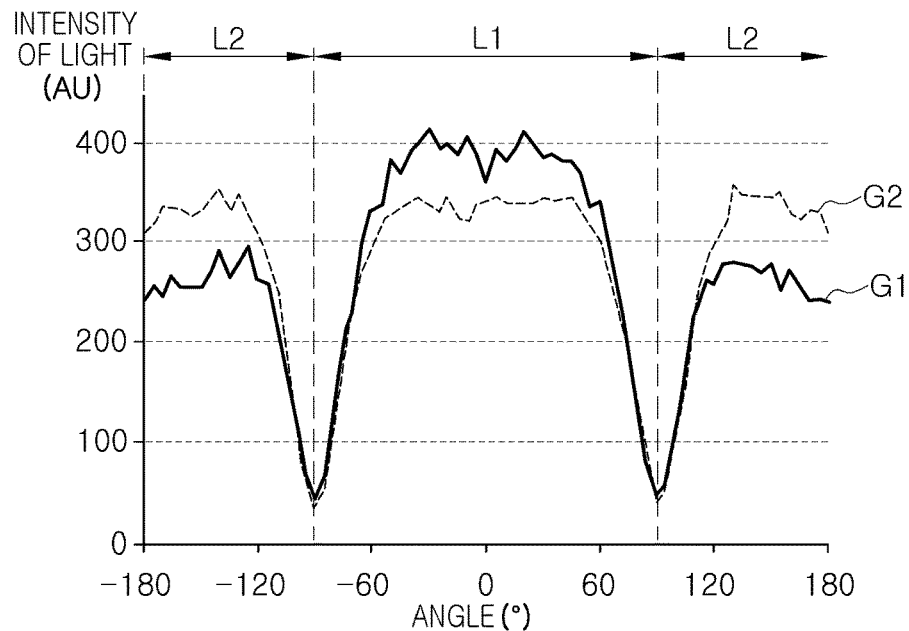
FIG. 7 is a view comparing intensities of light of an exemplary example and a comparative example of the present disclosure.

FIG. 7 is a view comparing intensities of light of an exemplary example and a comparative example of the present disclosure.

As a result of measuring intensities of light of an LED device according to an exemplary example and a comparative example in which a reflective layer is not disposed, it can be confirmed that, compared with a comparative example G2, in the case of an exemplary example G1, an intensity of light of a forward light L1 is increased, and an intensity of light of a rearward light L2 of an LED device 100*a* is reduced. Thus, light emitted rearwardly from the plurality of LED devices 100 to interfere with each other may be reduced, thereby improving color rendering of an LED lamp 10 and increasing the intensity of light.

Figure 8A:
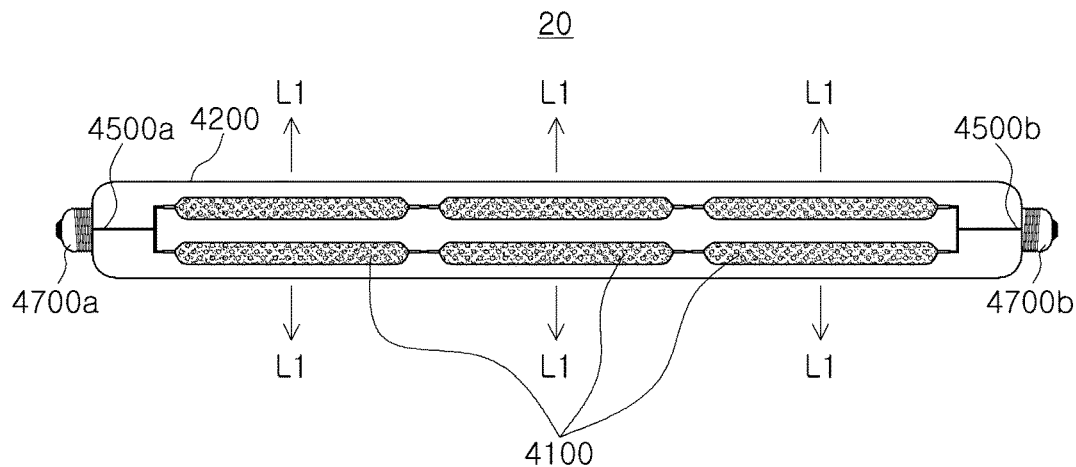
FIGS. 8A and 8B illustrate LED lamps according to an example embodiment of the present disclosure.
Figure 8B:
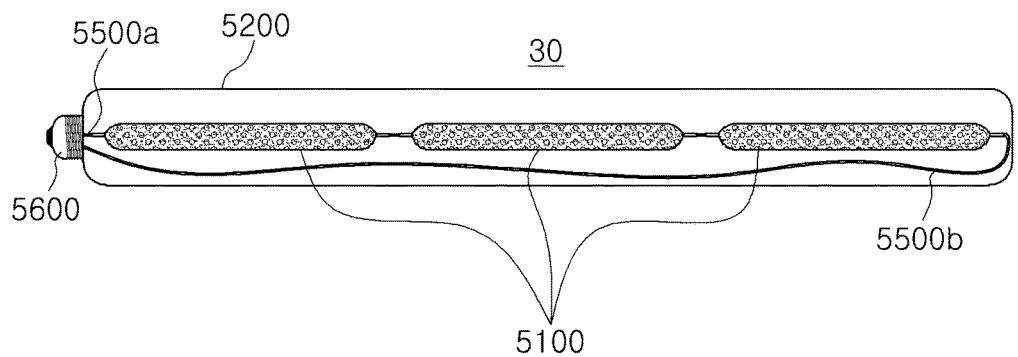

FIGS. 8A and 8B illustrate LED lamps according to an example embodiment of the present disclosure.

With reference to FIG. 8A, an LED lamp 20 according to an example embodiment has a feature in which a bulb 4200 is formed to have a bar-like shape that is elongated in a single direction, and a pair of base portions 4700*a* and 4700*b* are disposed on opposing ends of the bulb 4200, compared with an LED lamp according to an example embodiment described above. In addition, the LED lamp 20 has a feature in which a plurality of LED devices 4100 are disposed in a row in a direction. The plurality of LED devices 4100 may include surfaces on which LED chips are mounted on opposing sides thereof, thereby increasing an intensity of light of a forward light L1 in a direction of the opposing sides. The bulb 4200 and base portions 4700*a* and 4700*b* may be provided to satisfy standards of a fluorescent lamp of a related art to replace the fluorescent lamp of the related art.

With reference to FIG. 8B, an LED lamp 30 according to an example embodiment has a feature in which, compared with an LED lamp according to an example embodiment described above, a bulb 5200 is formed to have a bar-like shape that is elongated in a single direction, and a plurality of LED devices 5100 are connected to each other in series in a single direction.

As set forth above, according to example embodiments of the present disclosure, an LED device and an LED lamp including the same may increase an intensity of light and color rendering due to reduced optical interference between LED devices.

According to example embodiments of the present disclosure, an LED device may reduce optical interference through a rear surface of the LED device in such a manner that the intensity of light of a front surface thereof is increased, by about 10% to about 40%, than that of the rear surface based on a wavelength band of 400 nm to 800 nm.

While example embodiments have been shown and described above, it will be apparent to those skilled in the art that modifications and variations could be made without departing from the scope of the present disclosure as defined by the appended claims.

What is claimed is:

1. A light emitting diode (LED) device comprising:
a transparent substrate having a bar-like shape and comprising a first surface and a second surface opposed to the first surface;
a plurality of LED chips mounted on the first surface of the transparent substrate, one LED chip of the plurality of LED chips comprising a reflective layer, the plurality of LED chips being surface-mounted on the transparent substrate;
a first connection terminal and a second connection terminal that are disposed on opposing ends of the transparent substrate and electrically connected to the plurality of LED chips;
a bonding layer interposed between the plurality of LED chips and the transparent substrate and comprising a metal filler; and
a wavelength conversion portion covering the first surface of the transparent substrate, the second surface of the transparent substrate, and the plurality of LED chips,
wherein based on a plane extended from the first surface, a first portional area of a first portion of the wavelength conversion portion disposed on the first surface is greater than a second portional area of a second portion of the wavelength conversion portion disposed on the second surface.

2. The light emitting diode (LED) device of claim 1, wherein the one LED chip of the plurality of LED chips further comprises:
a light transmissive substrate;
a light emitting structure comprising:
a first conductivity-type semiconductor layer;
an active layer; and
a second conductivity-type semiconductor layer,
wherein the light emitting structure is disposed on an upper surface of the light transmissive substrate, and the reflective layer is formed directly on a lower surface of the light transmissive substrate.

3. The light emitting diode (LED) device of claim 1, wherein the reflective layer is formed in such a manner that a pair of titanium dioxide ($TiO_2$) film and silicon dioxide ($SiO_2$) film are stacked.

4. The light emitting diode (LED) device of claim 1, wherein the reflective layer has a first area substantially corresponding to a second area of a mounting surface of the one LED chip of the plurality of LED chips.

5. The light emitting diode (LED) device of claim 1, wherein the bonding layer is an opaque bonding layer.

6. The light emitting diode (LED) device of claim 1, wherein the metal filler of the bonding layer comprises an aluminum (Al) filler.

7. The light emitting diode (LED) device of claim 1, wherein the wavelength conversion portion comprises a transparent resin layer in contact with the transparent substrate and the plurality of LED chips, and a wavelength conversion layer covering the transparent resin layer and comprising a wavelength conversion material.

8. The light emitting diode (LED) device of claim 1, wherein the first connection terminal and the second connection terminal comprise a first fixing groove and a second fixing groove, respectively, which indicate a first direction of the first surface or a second direction of the second surface.

9. A light emitting diode (LED) lamp comprising:
a bulb;
a base portion connected to an end of the bulb;
a plurality of LED devices disposed in an internal space of the bulb and disposed above a central portion of the internal space; and
a connection frame,
wherein one LED device of the plurality of LED devices comprises:
a transparent substrate having a bar-like shape and comprising a first surface and a second surface opposed to the first surface;
a plurality of LED chips mounted on the first surface of the transparent substrate, one of the plurality of LED chips comprising a reflective layer, the plurality of LED chips being surface-mounted on the transparent substrate;
a first connection terminal and a second connection terminal that are disposed on opposing ends of the transparent substrate and electrically connected to the plurality of LED chips;
a bonding layer interposed between the plurality of LED chips and the transparent substrate and comprising a metal filler; and
a wavelength conversion portion covering the first surface of the transparent substrate, the second surface of the transparent substrate, and the plurality of LED chips, the first surface being disposed toward the bulb,
wherein the one LED device and another LED device of the plurality of LED devices are electrically connected in series via the connection frame, and
wherein based on a plane extended from the first surface, a first portional area of a first portion of the wavelength conversion portion disposed toward the bulb is greater than a second portional area of a second portion of the wavelength conversion portion, and a surface of the second portion of the wavelength conversion portion is disposed toward the central portion.

10. The light emitting diode (LED) lamp of claim 9 further comprising:
a support disposed in the central portion and having one end attached to the base portion and another end attached to the connection frame; and
an electrode frame attached to an intermediate portion of the support,
wherein the first connection terminal and the second connection terminal are connected to the connection frame and the electrode frame, respectively.

11. The light emitting diode (LED) lamp of claim 10, wherein the first connection terminal and the second connection terminal comprise a first fixing groove and a second fixing groove, respectively, in which the connection frame or the electrode frame is attached.

12. The light emitting diode (LED) lamp of claim 9, wherein one LED chip of the plurality of LED chips comprises:
a light transmissive substrate;
a light emitting structure comprising:
a first conductivity-type semiconductor layer;
an active layer; and
a second conductivity-type semiconductor layer,
wherein the light emitting structure is disposed on an upper surface of the light transmissive substrate; and
a first electrode and a second electrode electrically connected to the first conductivity-type semiconductor layer and the second conductivity-type semiconductor layer, respectively, the first electrode and the second electrode being disposed opposite to the first surface of the transparent substrate on which the plurality of LED chips are mounted.

13. The light emitting diode (LED) lamp of claim 9, wherein a light emitting layer in one LED chip of the plurality of LED chips has a structure in which a plurality of pairs of $TiO_2$ film and $SiO_2$ film are stacked.

14. A light emitting diode (LED) lamp comprising:
a bulb;
a base disposed below the bulb;
a plurality of LED devices disposed inside the bulb, one LED device of the plurality of LED devices comprising:
   a transparent substrate having an elongated shape and comprising one side that is facing outwardly out of the bulb in an outward direction; and
   a plurality of LED chips mounted on the one side of the transparent substrate, one LED chip of the plurality of LED chips comprising:
      a light emitting structure; and
      a reflective layer disposed between the light emitting structure and the transparent substrate, and configured to reflects light emitted from the light emitting structure which travels in an inward direction toward the transparent substrate, toward the outward direction;
   a connection frame electrically connecting two of the plurality of LED devices in series; and
   a wavelength conversion portion which covers the transparent substrate and the plurality of LED chips and which has an asymmetric cross sectional area, the asymmetric cross sectional area being configured so as to increase an intensity of light that is emitted toward the outward direction.

15. The light emitting diode (LED) lamp of claim 14, wherein a first center of the bulb and a second center of the base are disposed along a central axis and wherein the outward direction is a direction which is not toward the central axis.

16. The light emitting diode (LED) lamp of claim 15, wherein the plurality of LED devices are disposed about the central axis.

17. The light emitting diode (LED) lamp of claim 15, wherein the asymmetric cross sectional area is further configured so that an outward portional area of the asymmetric cross sectional area above the one side of the transparent substrate is larger than an inward portional area of the asymmetric cross sectional area below the one side of the transparent substrate.

* * * * *